United States Patent [19]

Orlowski et al.

[11] Patent Number: 4,970,553
[45] Date of Patent: Nov. 13, 1990

[54] ELECTRICAL COMPONENT WITH CONDUCTIVE PATH

[75] Inventors: Thomas E. Orlowski, Fairport; Joseph A. Swift, Ontario, both of N.Y.

[73] Assignee: Xerox Corporation, Stamford, Conn.

[21] Appl. No.: 445,230

[22] Filed: Dec. 4, 1989

[51] Int. Cl.⁵ .................. G03G 15/00; H05K 1/00; B23K 31/00
[52] U.S. Cl. .................. 355/200; 174/258; 219/121.65; 219/121.66; 219/121.85
[58] Field of Search .............. 355/200; 174/257, 258, 174/264; 219/121.65, 121.66, 121.85

[56] References Cited

U.S. PATENT DOCUMENTS

| | | | |
|---|---|---|---|
| 3,626,143 | 12/1971 | Fry | 219/121.66 |
| 4,159,414 | 6/1979 | Suh et al. | 219/121.35 X |
| 4,286,250 | 8/1981 | Sacchetti | 338/306 |
| 4,489,230 | 12/1984 | Yamamoto | 219/121.85 |
| 4,563,078 | 1/1986 | Fantuzzo et al. | 355/200 |
| 4,584,456 | 4/1986 | Oodaira et al. | 219/121.66 X |
| 4,648,179 | 3/1987 | Bhattacharyya et al. | 174/258 X |
| 4,691,091 | 9/1987 | Lyons et al. | 219/121.85 |
| 4,764,485 | 8/1988 | Loughran et al. | 219/121.65 X |
| 4,841,099 | 6/1989 | Epstein et al. | 174/258 |

FOREIGN PATENT DOCUMENTS 2647796 4/1978 Fed. Rep. of Germany .

OTHER PUBLICATIONS

IBM Technical Disclosure Bulletin Publication Entitled "Metal Plating of Pyrolyzate Circuitry", T. F. Saunders et al., vol. 9, #11.

Primary Examiner—Morris H. Nimmo

[57] ABSTRACT

A three dimensional electrical component having a first side and a second side formed from an electrically insulating polymer matrix capable of heat conversion to an electrically conducting polymer matrix has at least one passageway from the first side to the second side having a tapered wall slope configuration from the first side to the second side with constantly changing cross section of the passageway from the first side through the passageway to the second side, an electrically conducting path between the first side and the second side formed by the in situ heat conversion of the walls of the passageway in the electrically insulating polymer matrix. In a preferred embodiment the electrically conducting path is formed by directing a laser beam to the walls of the passageway to heat the insulating polymer matrix to a temperature sufficient to convert it to an electrically conducting polymer matrix.

46 Claims, 5 Drawing Sheets

ELECTRICAL COMPONENT WITH CONDUCTIVE PATH

BACKGROUND OF THE INVENTION

The present invention relates generally to electrical components, methods for making electrical components and machines employing electrical components. In particular, it relates to three dimensional electrical components comprising an electrically insulating polymer matrix which is capable of heat conversion to an electrically conducting polymer matrix where at least one electrically conductive path is formed in situ between the first side and second side of the polymer matrix. More specifically, the three dimensional electrical component may be a two-sided circuit board or a frame or structural member in a machine such as automatic reproducing machines including office copiers, duplicators and printers.

In a typical electrostatographic reproducing machine, a photoconductive insulating member is uniformly charged and exposed to a light image which discharges the exposed or background areas and creates an electrostatic latent image on the member corresponding to the image contained within the original document. Alternatively, a light beam such as a laser beam may be modulated and used to selectively discharge portions of the photoconductive surface to record the desired information thereon. The electrostatic latent image is made visible by developing the image with developer powder referred to in the art as toner which may be subsequently transferred to a support surface such as paper to which it may be permanently affixed by heating pressure or the application of heat and pressure.

In commercial applications of such products it is necessary to distribute power and/or logic signals to various sites within the machine. Traditionally, this has taken the form of utilizing conventional wires and wiring harnesses in each machine to distribute power and logic signals to the various functional elements in an automated machine. While the conventional approach has been immensely effective in producing convenience products, with increasing demands on manufacturing cost and the desire for automated assembly, different approaches have to be provided. For example, since individual wires and wiring harnesses are inherently very flexible, they do not lend themselves to automated assembly such as with the use of robotics. Furthermore, such harnesses may have to be handled or moved several times to make all connections required. This is a highly labor intensive task frequently requiring routing of the several harnesses through channels and around manually with the final connections being also accomplished manually thereby resulting in potential human error in the assembly. The potential for human error is reduced with the use of automated and in particular robotic assembly. In addition to the relatively high labor costs associated with harness construction and installation of electrical wiring harnesses it is well to note that there are less than totally reliable in producing their intended function. Furthermore, and with increasing sophistication of the capabilities of such products, a plurality of wiring harnesses may be required in any individual machine which can require a large volume of space thereby increasing the overall size of the machine. Accordingly, there is a desire to provide an alternative to the conventional wiring and wiring harnesses that overcomes these difficulties.

PRIOR ART

In U.S. Pat. No. 4,841,099 to Epstein, et al. it is has recently been proposed to provide electrical components and support members for a machine with continuous electrically conducting paths between electrical components formed by the in situ heat conversion of electrically insulating fibrous filler held within an electrically insulating structural polymer matrix. The electrically conductive pattern may be formed by exposure of the component or the support member to a laser beam through a mask containing the desired pattern. Subsequent to the formation of the electrically conductive trace or path, the pattern may be electroplated if desired to attain metallic conductivity.

U.S. Pat. No. 4,691,091 to Lyons et al. describes producing conductive patterns in a polymeric substrate that may be used in the manufacture of circuit boards wherein a laser beam is moved across the substrate to trace a desired pattern and the polymer decomposes to produce a conductive pattern. Further, the conductivity of the laser writing path can be enhanced by electroplating a conductor metal or alloy onto the path.

These techniques provide an economical alternative to conventional wiring and wiring harness construction and also facilitate automated manufacture thereby reducing assembly cost and human error. They further have the advantage of being able to integrate electrical and mechanical functions into the same piece part. Further, laser created circuitry can be placed on two sides of a circuit board or two sides of a structural member or adjoining or adjacent to such members. This, can require the formation of a hole or via in the circuit board or structural member to interconnect the circuitry on the two sides of the board or member. Generally, as previously discussed with conventional wiring techniques this is accomplished in a highly labor intensive manner which does not readily lend itself to automated assembly such as with the use of robotics.

West German Patent No. 2,647,796 to Zink is directed to a circuit board designed as the bottom of a casting which is produced by injection molding thermoplastic material so that the molded section has channels on the side for the printed wiring. The thermoplastic material is then activated and rendered electrically conductive and provided with a coating of a conductive material that forms the wiring paths in an electroplating bath. The process permits a high degree of automation, a three-dimensional profile and the elimination of wiring operations. The circuit board is designed as a cast piece with conical through holes to facilitate insertion of connecting wires.

IBM Technical Disclosure Bulletin, Vol. 9, No. 11, Apr. 1967, Page 1474 entitled "Metal Plating of Pyrolyzate Circuitry", to T. F. Saunders et al. is directed to fabricating printed circuits by the radiant energy pyrolyzation of an organic polymer coating on a substrate and produce a conductive carbonaceous pattern which is subsequently sensitized to immersed in an electroless copper plating bath to provide a copper film on the conductive pattern. The film thickness can be increased by electroplating.

U.S. Pat. No. 4,149,414 to Suh et al. is directed to forming electrically conductive paths on three dimensional substrates by exposing a polymer composition containing a metal compound preferably a metal oxide to a high intensity laser beam to reduce the metal compound to its elemental state thereby providing an electrically conductive path.

U.S. Pat. No. 4,286,250 to Sacchetti is directed to laser formed resistor elements wherein an insulator substrate has heat applied, for example, by directing a laser beam to a predetermined portion to provide a carbonized conductive resistor portion.

Another difficulty frequently encountered in circuitry or circuit boards is turning a corner with a portion of the circuit. Two difficulties are presented in that it is difficult to obtain a uniform thickness of metal plating for the conductive path around such a corner and such structural areas are typically prone to abrasion merely by their location resulting in increased wear and premature deterioration of the conductive path.

SUMMARY OF THE INVENTION

The present invention is directed to electrical components, methods for making electrical components and machines employing such electrical components. In a specific aspect, it is directed to a three-dimensional electrical component having a first side and second side and comprising an electrically insulating polymer matrix capable of heat conversion to an electrically conducting polymer matrix having at least one passageway from the first side to the second side having a tapered wall configuration with constantly changing cross section of the passageway from the first side through the passageway to the second side and an electrically conducting path between the first side and second side formed by the in situ heat conversion of the walls of the passageway in the electrically insulating polymer matrix.

In a further principle aspect of the present invention the electrically conductive path is formed in passageway of the electrically insulating polymer matrix by directing a a laser beam to the walls of the passageway to heat the polymer matrix to a temperature sufficient to convert it to an electrically conductive polymer matrix.

In a further aspect of the present invention the electrically insulating polymer matrix is filled with an electrically insulating fibrous filler capable of heat conversion to an electrically conducting fibrous filler such as a heat convertible carbonaceous fiber as for example thermally stabilized polyacrylonitrile fibers.

In a further aspect of the present invention the walls of the passageway have an adherent continuous coating of a conductive metal.

In a further aspect of the present invention the electrical component comprises a plurality of passageways providing a plurality of electrically conducting paths between the first side and second side.

In a further aspect of the present invention, the walls of the passageway taper down from a maximum cross section on the first side to a minimum cross section on the second side.

In a further aspect of the present invention, the walls of the passageway taper down from maximum cross sections at both the first and second sides to a minimum at some point between the first and second sides and a laser beam is directed to the walls of the passageway from the first side and the second side to form the conducting path.

In a further aspect of the present invention the first side and second side meet to form an angled corner which has at least one passageway providing an electrically conducting path through the interior of the corner from the first side to the second side.

In a further aspect of the present invention, electrical circuits are present on each of the first and second sides of the electrical component and are connected by a conductive path.

In a further aspect of the present invention, the insulating polymer matrix has a resistivity greater than about $10^{14}$ ohms-cm and the electrically conductive path has a resistivity less than about $10^9$ ohms-cm. and preferably less than $10^3$ ohm-cm.

Other features of the present invention will become apparent as the following description proceeds and upon reference to the drawings.

BRIEF DESCRIPTION OF THE DRAWINGS

FIGS. 2A-2D are views in cross section of a laser patterned via through an insulating polymer matrix at four different times in the sequence of manufacturing operations.

DESCRIPTION OF THE PREFERRED EMBODIMENT

The invention will now be described with reference to a preferred embodiment of an electrical component according to the the present invention.

In accordance with the present invention, an alternative to the connection of circuit patterns on both sides of a circuit board by the manual manipulation of wires and fastening of wires to connectors is provided which will enable a significant degree of automated assembly. According to the present invention, a three dimensional electrical component having a first side and second side comprised of an electrically insulating polymer matrix capable of heat conversion to an electrically conducting polymer matrix has at least one passageway or via from the first side to its second side having a tapered wall configuration from the first side to the second side with a constantly changing cross section of the passageway from the first side through the passageway to the second side has an electrically conducting path between the first side and second side formed by the in situ heat conversion of the walls of the passageway in the electrically insulating polymer matrix.

Figure 1:
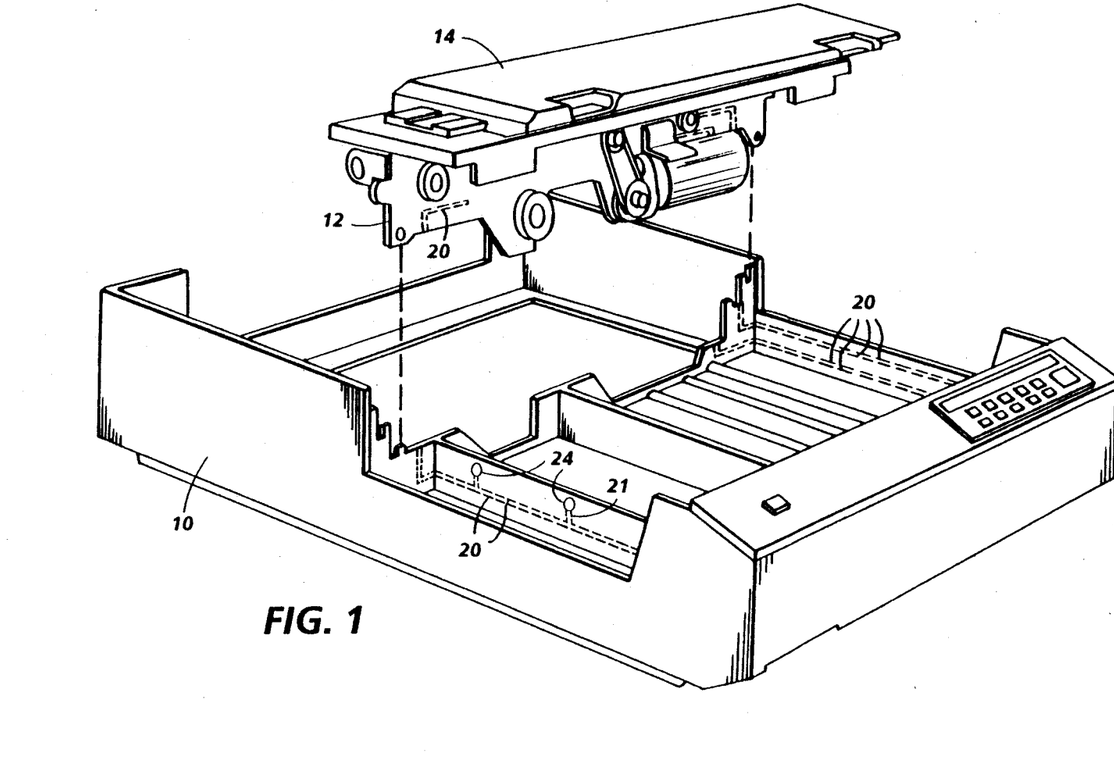
FIG. 1 is an isometric view partially exploded of a portion of the frame section of an electrostatographic printing apparatus with a representative illustration of a circuit pattern formed in situ providing conducting paths and a hole or via providing a conductive passageway from one side to the other side of a structural member.

Referring now to FIGS. 1 and 2, the significance of the present invention will be immediately appreciated. In FIG. 1, a structural frame 10 together with drive module 12 and platen drive module 14 are illustrated as parts of an electrostatographic reproducing apparatus. For further description of the machine elements and its manner of operation attention is directed to the U.S. Pat. No. 4,563,078. Also illustrated are electroconductive paths or traces 20 which may be formed directly into the machine support frame 10 in the manner described in the above reference U.S. Pat. No. 4,841,099. Also illustrated are conductive traces 21 to vias 24 which will be more completely described with reference to FIG. 2.

Figures 2A, 2B, 2C, 2D:
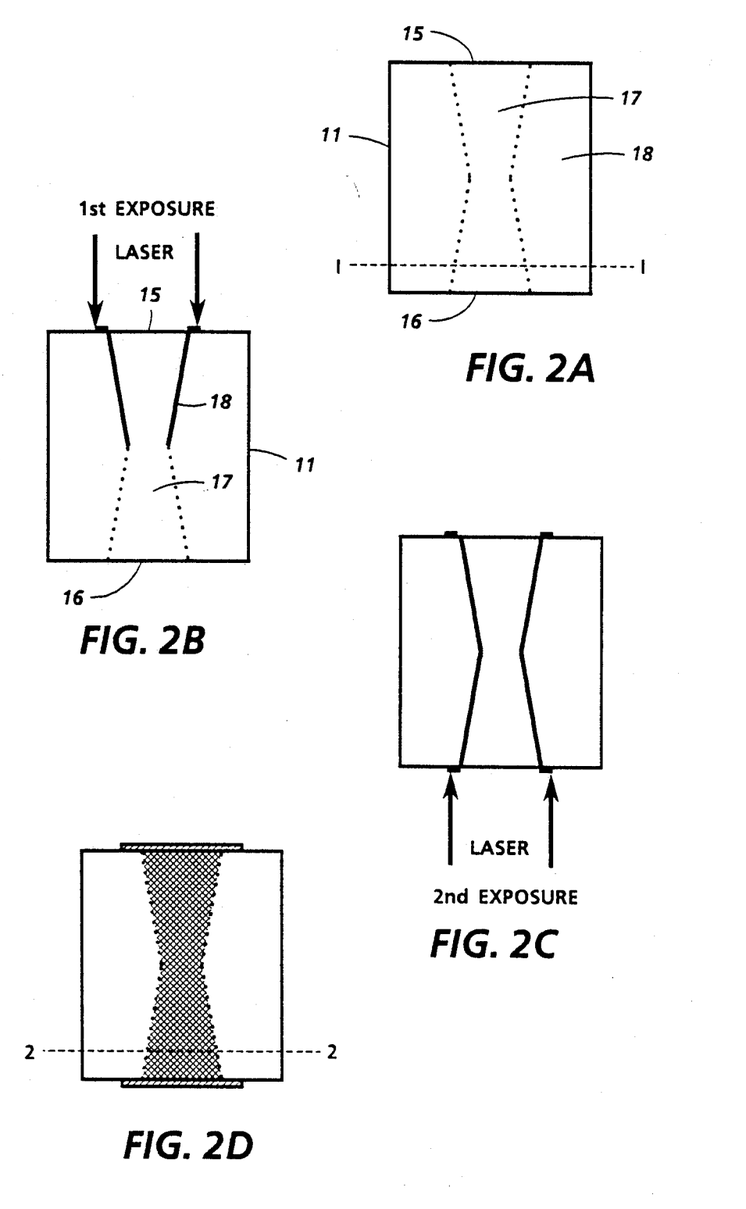
FIG. 2A illustrates joined holes with conical cross section.
FIG. 2B illustrates an exposure of one conical hole by a laser beam rendering it conducting.
FIG. 2C illustrates the second exposure of the second conical hole forming a continuous conducting trace.
FIG. 2D represents an electroplated via.

FIGS. 2A-2D illustrate a preferred embodiment of a laser patterned via according to the present invention. In FIG. 2A a cross section of a circuit board 11 is illustrated having a connecting passageway 17 between a first side 15 and a second side 16. The cross section of the connecting passageway illustrates conically shaped holes which are joined at or near the center. In FIG. 2B one portion of the conical hole is exposed to a laser beam to heat the insulating polymer matrix 18 to a temperature sufficient to convert the electrically insulating polymer matrix to an electrically conducting polymer matrix. FIG. 2C schematically illustrates the exposure of the second portion conical hole to the laser beam to heat it to a temperature sufficient to convert the electrically insulating polymer matrix to an electrically conducting polymer matrix. The second exposure produces a continuous conducting trace from the first side to the second side of the circuit board. FIG. 2D illustrates the embodiment wherein the conducting walls of the passageway have been electroplated with conductive metal to produce a via of metallic conductivity.

The electrically insulating polymer matrix may be formed from any suitable host polymer which is electrically insulating. The polymer may be selected from a wide range of commercially available materials which are suitable for molding or other shaping methods such as, for example, casting, extrusion, pultrusion and transfer molding. Polymers which are hydrophobic, exhibiting low moisture uptake are preferred due to their more stable volume resistivity at high relative humidity. Naturally, polymers which are non-toxic and have non-toxic thermal decomposition products are preferred. The polymer may, for example, be selected from a wide range of thermoplastic and thermosetting polymers as well as structural foams of these materials. Typical materials include polystyrene, polycarbonate, polyamides, polyesters, phenolics, epoxies, vinyl esters and the like. In addition, suitable elastomers such as, for example, silicones, urethanes, Hypalons, EPDMs and foams thereof may be used. When used as a structural member, it is naturally preferred to employ conventional engineering structural polymers. Typical of such thermoplastic polymers are the ABS resin acrylonitrile-butadiene-styrene copolymer which may be a blend produced from all three monomers or mixtures of copolymers or graft polymers such as styrene and acrylonitrile grafted on polybutadiene. In addition, other high temperature engineering plastics such as polysulfone, polyphenylene sulfide, polyether imides, poly(amide-imide) and fluoroplastics may be used.

The electrically insulating polymer may be used singularly to form the circuit board or structural member or alternatively it may be loaded or filled with a suitable polymeric fibrous material or it may be a suitable coating on a substrate capable of heat conversion to conductive fibrous carbon within the polymeric matrix. Suitable substrate materials capable of heat conversion to an electrically conducting polymer matrix include the phenolic materials such as phenol formaldehyde. Also suitable are polyamides such as Kapton available from E. I. Dupont de Nemours. Alternatively, the electrically insulating polymer may be loaded with any suitable polymeric fibrous material capable of heat conversion to conducting fibrous material within the polymer matrix. Typical of such fibrous filler are cellulose (rayon) and petroleum pitch based carbon fibers which are heat convertible carbonaceous fibers. A particularly preferred carbonaceous fiber or filler is thermally stabilized, polyacrylonitrile fibers which upon heat conversion provide electrically conducting fibers. These fibers are thermally stabilized by heating polyacrylonitrile fibers to temperatures of the order of 300° C. in the presence of oxygen and usually under tension for a long period of time of up to twenty four hours wherein the polyacrylonitrile is changed from a white to black fiber while maintaining its electrically insulating characteristics. These thermally stabilized fibers also known as preox fibers and can be made electrically conducting upon subsequent heat treatment to temperatures of the order of 2000° C. in an inert atmosphere.

As used herein, the term electrically insulating is intended to define materials having a resistivity greater than about $10^{14}$ ohm centimeters and the term electrically conducting is intended to define materials having a resistivity less than about $10^9$ ohm centimeters. The degree of loading the polymer matrix with the fibers is such that upon the heat conversion of the fibers the converted fibers are in electrical contact providing an electrically conducting path in the polymer matrix. Typically, the fibers may be included in the polymer matrix in an amount of from about 5% to 70% by weight of the total filled polymer matrix. Preferably, however, from about 10 to 30% by weight of the polymer matrix is made up of the fibers. Since the cost of the fibers is substantially more than the cost of the polymer this range generally provides a good balance between cost and filler function in addition to providing the conducting path. At higher fiber loadings, greater reinforcement and strength is achieved in the composite. In addition, lower fiber loadings may present fewer difficulties in dispersing the fiber in the polymer. If desired, the fibers can have an adhesion promoter such as polyvinyl alcohol, polyvinyl chloride or epoxy monomers thereon to enable the polymer in the fluid state when it is heated to readily adhere to the fibers. In addition, other additives such as fiber glass or flame retardants such as halogenated hydrocarbons may be added to the polymer matrix for additional reinforcement and flame retardency respectively. Typically, the fibers have a length much greater than the diameter with the length being from about 1 to about 12 millimeters and the diameter from about $5 \times 10^{-3}$ to about $5 \times 10^{-2}$ millimeters. It is important that the fibers be of sufficient length that upon pyrolysis they are capable of bridging the area from the pyrolyzed polymer matrix to the bulk of the unpyrolyzed polymer matrix to give durability to the final product. It is therefore important that the fibers maintain their fibrous nature during the compounding operation that result in a uniform dispersion of fibers throughout the polymer matrix. In addition to the fibers providing the conductive path following heat conversion, they also add structure to the host polymer acting to strengthen and stiffen it. In some applications compounding and molding techniques such as 2-shot molding, for example, that cause the fibers to preferentially move to the surface may be preferred.

The filled polymer matrix may be formed into an electrical component by conventional molding or extruding techniques. A particularly preferred technique is injection molding wherein three dimensional parts may be made in a very short time which do not require any post machining such as drilling or routing. If the electrical component is to be used as a support member such as the structural frame member or corner the polymer used should be one of the structural polymers mentioned above.

Figure 4:
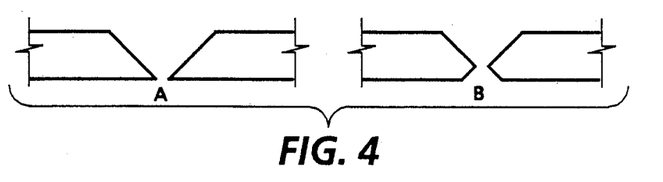
FIGS. 4A and 4B illustrate two alternative cross section embodiments from one side to the other side of the electrical component.
Figure 5:
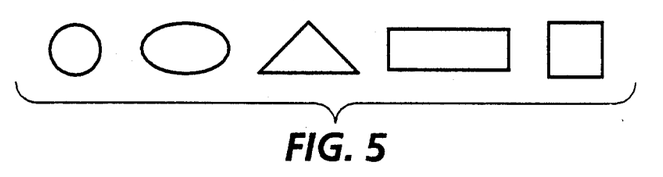
FIG. 5 illustrates alternative cross-sectional configurations along a line 1:1 as illustrated in FIG. 2A.
Figure 6:
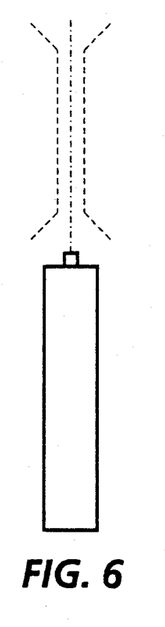
FIG. 6 is a comparative figure illustrating the difficulties in exposing all the surface of a tubular via or other via having parallel sides when compared with FIGS. 2A-2D.
Figure 8:
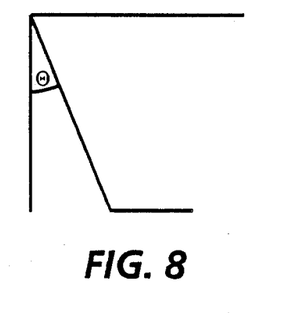
FIG. 8 illustrates the minimum angle or slope between the tapered wall and the perpendicular to the surface.

The holes or vias forming the passageways may be formed in the electrical component with conventional techniques such as drilling, boring or molding. Alternatively, a laser beam may be used to form the via by sputtering through the polymer matrix. Typically, a laser such as an Eximer laser, an utraviolet laser, or one that will ablate the polymer matrix forming a clean hole without deforming it and having a typical pulse energy density of 1 Joule per centimeter squared is employed. It is important that the passageways have a tapered wall configuration from one side toward the other side of the electrical component to facilitate completely adequate exposure of the wall surfaces to the heating laser beam. The tapered wall configuration in the hole or via may be formed with the Eximer laser by controlled movement of the laser relative to the electrical component. Since a laser is a collimated light source, if the object to which exposure is desired is cylindrical or has wall surfaces effectively parallel to each other as illustrated in FIG. 6, difficulties will be encountered in insuring that adequate exposure of all surfaces takes place to convert the electrically insulating polymer matrix to the electrically conducting polymer matrix. Accordingly, with a tapered wall surface as illustrated in FIGS. 2 and 4, the laser beam will always see the polymer matrix wall surface of the via. To expose the interior of a cylindrical-type structure with a laser beam the structural member would have to be moved relative to the laser beam and depending on its length it would be difficult to insure adequate heat conversion of the entire surface. In addition with such relative movement and prolonged exposure, deterioration of the electrical component by hole or via deformation is possible. Accordingly, it is important that there be no straight or parallel wall portions of the hole or via wherein the wall surfaces are parallel to each forming a tubular configuration. Furthermore, as illustrated in FIGS. 2 and 4, the cross section of the via or passageway is constantly changing as it is moved from the first side to the second side. Thus, in the embodiment illustrated in FIG. 4A, the walls of the passageway taper down from the maximum cross section on the first side of the electrical component to a minimum cross section on the second side. In this embodiment it will be understood that the conductive path may be formed with a single exposure to the laser beam. Alternative embodiments are illustrated in FIG. 4B and FIGS. 2A–2D wherein two holes of conical cross section are joined and the walls of the passageway tapered down from maximums at the first and second sides to a minimum between the first and second sides. It is important to note as illustrated in FIG. 5 that the cross section across the via or passageway along the line 1—1 indicated in FIG. 2A is virtually unlimited in configuration in that it may be eliptical, circular, triangular, rectangular, etc. as long as the configuration provides a tapered wall, slope configuration to enable exposure of the entire wall surface to the laser beam. In general, conical walls are preferred since they are the easiest to create. To ensure that adequate exposure of the walls of the passageway takes place, the walls typically have a slope of at least 10° as indicated by the angle $\Theta$ in FIG. 8 with respect to the perpendicular to one side of the electrical component and preferably have a slope greater than 20°. While there is no limit on the maximum size of the holes as a practical matter the standard sizes for chip sockets and integrated circuits are typically on the order of 50 mils.

In a preferred embodiment, the hole or via size cross section is selected to be slightly less than the spot size of the laser as illustrated in FIGS. 2B and 2C to ensure uniform exposure of the tapered walls of the passageway since otherwise if the size of the hole opening were larger than the spot size of the laser they would have be some relative movement between the electrical component and the laser potentially resulting in non-uniform heating of the tapered wall of the passageway or other deformation of the passageway.

Subsequent to the formation of the electrical component a portion of the insulating polymer matrix corresponding to the tapered wall configuration is exposed to a laser beam to heat the insulating polymer matrix to a temperature sufficient to convert it to an electrically conducting polymer matrix. In a preferred embodiment, the electrically insulating polymer matrix is filled with an electrically insulating fibrous filler which is capable of heat conversion to an electrically conducting fibrous filler. When the laser is directed to the tapered configuration of the passageway, it pyrolyzes a portion of the polymer matrix decomposing the polymer and heat converting the electrically insulating fibers to electrically conducting fibers to form the conductive path. Any suitable laser may be employed including continuous wave or pulsed lasers it being required only that it impinge on the polymer matrix for sufficient time and with sufficient power to raise the temperature of the polymer matrix and/or the fibrous filler to a temperature sufficient to render it electrically conducting. Both argon and carbon dioxide lasers are effective in this regard. The Eximer laser previously mentioned cannot be used since it is an ablating laser which would remove both the polymer matrix and any filler present therein whereas an argon or carbon dioxide laser is effective in converting the polymer matrix or removing a portion of the polymer matrix and converting the electrically insulating filler to electrically conducting filler.

During the pyrolysis, the polymer matrix is heated locally and undergoes a thermal melting and decomposition with the hottest areas decomposing with the potential for some volatile decomposition products cooling upon contact with and then condensing on adjacent areas. During the pyrolysis there may be some molten plastic flow in the via or passageway and the exposed fibers in the polymer matrix are converted to electrically conducting fibers and may be observed with the heat converting conducting portion of the fiber in the passageway and the remaining insulating portion in the unpyrolyzed polymer matrix. The fiber fill density in the polymer matrix should be sufficient to ensure a plurality of contact points between fibers to produce a continuous conducting fiber path.

The exposure or heat conversion is preferably carried out in an oxygen free atmosphere since oxygen tends to impede achieving high conductivity by incorporating itself into the fiber compositons. The polymer/fiber composition has to be capable of absorbing the laser energy and the product of the absorption must be the necessary rise in temperature to melt or vaporize the polymer and heat convert the fibers. In other words, the fiber filled polymer matrix must absorb light at the writing or marking wavelength of the laser and result in the necessary rise in temperature.

If it is desired to create a plurality of conducting paths or vias or passageways in a single piece part, a programmable bed or robot may be coupled in unison with the laser to move the laser beam relative to the electrical component to create the desired conductive paths. This may be accomplished by holding the laser beam or the workpiece stationary while the other is moved relative to the stationary item or by moving both the laser and the electrical component in a controlled manner. By controlling the relative motion of the laser beam relative to the electrical component, the conductive paths may be readily created in three dimensional objects.

Furthermore, the use of such a programmable bed enables the combination of the technique described in the above referenced U.S. Pat. No. 4,841,099 wherein a plurality of conductive paths may be formed in an insulating polymer matrix forming a circuit with the vias or passageways of the present invention at the same time. Accordingly, a circuit pattern may be formed on the surface of the electrical component by for example randomly or continuously exposing the electrical component to the laser through a mask having a predetermined conductive pattern thereby pyrolyzing that portion of the substrate through the pattern in the mask and at the same time enabling the laser to be directed to the walls of the vias or passageways to also render them conductive. This has the distinct advantage of enabling the formation of circuit patterns on two sides of a circuit board together with the necessary vias or passageways interconnecting the two sides of the circuit board.

Figure 9:
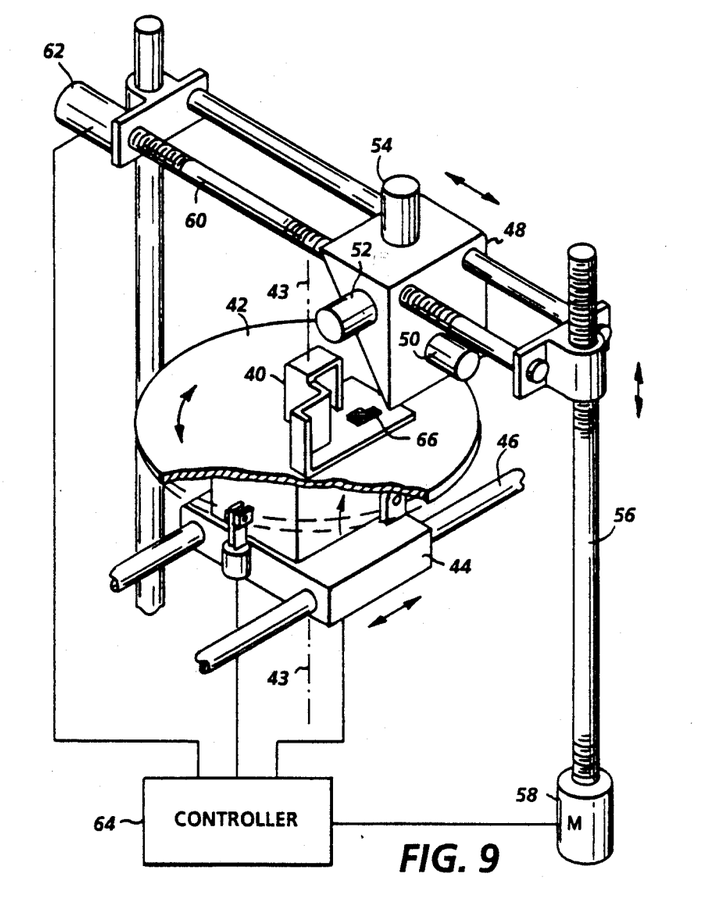
FIG. 9 is a schematic illustration of a system for forming the electrically conductive traces in a structural member.

Attention is directed to FIG. 9 which schematically illustrates a manner in which a plurality of conductive paths representing circuit patterns can be prepared in a part. The part 40 is secured to table 42 which is rotatably mounted about the center axis 43 of a motor shaft (not shown) in the motor box 44. In addition, the table is movable in the XY plane by movement of worm gear 46 by another motor (not shown) in the motor box 44. The laser scanning carriage 48 has three laser ports 50, 52, 54, one directed in each direction with the carriage movable vertically by worm gear 56 and motor 58 and horizontally by worm gear 60 and motor 62. The movement of the table 42 and the scanning carriage 48 is controlled by a programmable controller 64 to form the preselected pattern of conductive traces in the part 40. If desired, a mask 66 having a predetermined pattern may be placed on the part. The laser scanning operation may be carried out in an input duct to bath the part in an inert gas such as nitrogen may be used. Further in an inert atmosphere or a vacuum chamber. Alternatively or in addition an exhaust hose may be placed adjacent the part being marked to remove any noxious materials produced by pyrolysis.

The above-described process is effective in producing conducting vias and passageways that are sufficiently conducting to support a current flow or voltage and may be used in any application that does not require a great deal of current. Typically, the electrically conductive path has a resistivity less than about $10^9$ ohm cm and preferably is more conductive having a resistivity less than about $10^3$ ohm cm. There may be situations in which metallic conductivity is desired in the vias or passageways to enable applications wherein greater current is used or provide increased reliability over time by improving the physical integrity of the conductive path.

Accordingly, conventional electroless or electroplating techniques and materials such as those described in the above referenced Saunders publication may be used to provide metallic conductivity to the conductive paths and to enable the plating of conducting metal into the hole or via, through the via and out the other side. Typical metals that may be employed include copper, nickel, gold, silver, tin, lead and platinum. Metallic plating also has the advantage in that it insures reliability of the mechanical interconnects between piece parts. In the plating process the conductive fibers are not only sites for plating but also promote adhesion of the plating to the substrates. In this process the groove formed also helps mechanical bonding.

Figure 10:
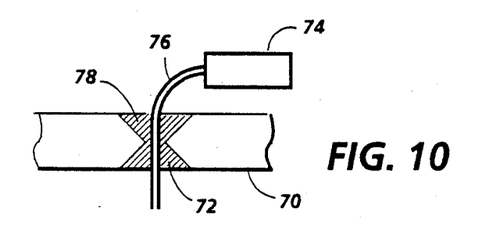
FIG. 10 is a view in cross section of a circuit board having a hole or via and another electrical component mounted and connected thereto.

FIG. 10 schematically illustrates a circuit board 70 having a hole 72 extending from one side to the other side and having located, mounted and connected thereto another electrical component such as a resistor, capacitor, etc. 74 with the lead 76 being secured by solder 78 in the hole.

Figure 7:
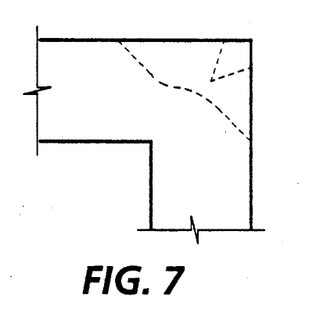
FIG. 7 illustrates the use of a via according to the present invention in a corner application.

FIG. 7 illustrates a particular embodiment wherein the practice according to the present invention solves the problem of deterioration of a plated metal circuit on a corner of an electrical component wherein the corner is crossed by providing a conducting via or passageway through the interior of the corner from the two exterior sides.

Figure 3A:
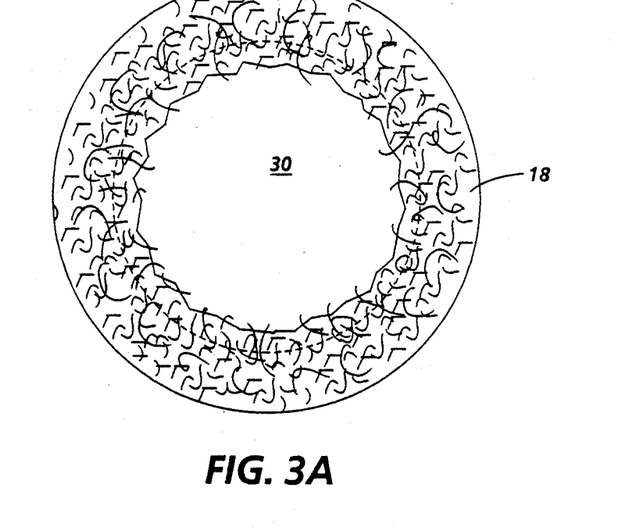
FIGS. 3A and 3B are enlarged views of the electrically conducting paths through section 1:1 of FIG. 2A and section 2:2 of FIG. 2D, respectively.
Figure 3B:
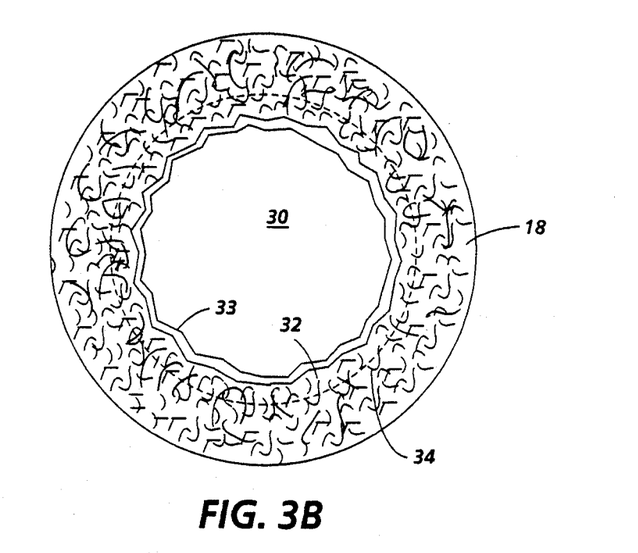

FIGS. 3A and 3B illustrate a hole or via 30 formed in the polymer matrix 18 and melting of the polymer matrix and some decomposition of the polymer locally in response to exposure to the laser beam. As a result of the melting and decomposition, a portion the of individual fibers 32 has been exposed to the laser beam and heat converted from insulating to conducting. Preferably, this exposure conversion takes place in an oxygen-free atmosphere. While portion 32 of the individual fibers has been heat converted, it should be noted that a portion 34 of the individual fibers continues to extend into the polymer matrix 18 and has not been heat converted and serves to anchor the fibers in place in the polymer matrix. It will be appreciated that the two portions of the fibers 32 and 34 are essentially the same size, any apparent difference in size in FIGS. 3A, 3B being only for purposes of illustration and distinction. They also serve to provide an enhanced adhesion to any metallic plating 33 that may be subsequently performed on the electrical component as illustrated in FIG. 3B.

EXAMPLE

Test Squares 2"×2" and 0.124" thick were made of injection molded polyphenylene oxide, General Electric Noryl resin, with 30% by weight of the total weight being heat stabilized, pre-ox polyacrylonitrile fibers chopped to lengths of about six millimeters with diameters of about 10 microns. Each square had 3 to 4 holes 0.050 inch in diameter drilled and reamed on both sides to provide a tapered hole. The reamed diameter on both surfaces was about 0.150 inches. The test squares were placed on a programmable sample table in a vacuum chamber with a transparent window for passage of a continuous wave laser beam while argon flowed continuously over the samples in the chamber at pressure of $50 \times 10^{-3}$ Torr. The tapered walls of the holes or vias in the test plaque were exposed to a focused continuous wave $CO_2$ laser having a spot size of 300 microns. In addition a conducting pattern of crosses was formed on both sides of the test plaque by the same laser operating at a power of 2 watts while the table was moved at a speed of about 1" per minute. Following the laser pyrolysis, a 1 mil thick copper plating was formed in the holes or vias and the conducting pattern by standard electroplating techniques from a bath of copper sulfate and sulfuric acid, the plating only being accomplished in the conducting paths and vias. Metallic conductivity was achieved in the plating on the via passageways as well as the conducting pattern.

Accordingly, the present invention provides a simple and economical alternative to conventional wiring in the construction of double side electrical components and three dimensional circuitry. Further it enables very simple plating of the via between the two sides of the electrical component. It further enables the formation of conductive patterns on one or more sides of an electrical component as well as the connection between them. It thereby provides enormously simple and economical fabricating techniques and has the capability of increasing circuit density and enabling miniaturization of electrical components. In addition by virtue of the tapered wall configuration, exposure of the wall to the laser beam to insure uniform adequate heating is much simpler and does not require the exposure of a straight hole or other opening with parallel wall surfaces. The tapered wall configuration further facilitates component loading into the hole or via by providing a guide path for an element being inserted in the hole. It further enables the location of miniature components in custom designed circuit boards. The manufacturing process also has relatively low power requirements and low tooling costs.

The disclosure of the patents and other references referred to herein are hereby specifically and totally incorporated herein by reference.

While the invention has been described with reference to specific embodiments, it will be apparent to those skilled in the art that many alternatives, modifications and variations may be made. While the invention has been described with specific reference to elastostatographic copier and printer machines, it will be appreciated that it has application to a large array of machines with electrical components. Accordingly, it is intended to embrace all such alternatives and modifications as may fall within the spirit and scope of the appended claims.

We claim:

1. A three dimensional electrical component having a first side and a second side comprising an electrically insulating polymer matrix capable of heat conversion to an electrically conducting polymer matrix, at least one passageway from said first side to said second side having a tapered wall configuration from said first side to said second side with constantly changing cross section of the passageway from said first side through the passageway to said second side, an electrically conducting path between said first side and said second side formed by the in situ heat conversion of the walls of said passageway in said electrically insulating polymer matrix.

2. The electrical component of claim 1 wherein said electrically insulating polymer matrix comprises an electrically insulating polymeric material capable of heat conversion to an electrically conducting material.

3. The electrical component of claim 1 wherein said electrically insulating polymer matrix is filled with an electrically insulating fibrous filler capable of heat conversion to an electrically conducting fibrous filler.

4. The electrical component of claim 1 wherein the walls of said passageway have an adherent continuous coating of a conductive metal plated thereon.

5. The electrical component of claim 1 wherein said at least one passageway comprises a plurality of said passageways providing a plurality of electrically conducting paths between said first side and said second side.

6. The electrical component of claim 3 wherein said electrically insulating fibrous filler is heat convertible carbonaceous fibers and said electrically conducting path comprises in situ heat converted carbonaceous carbonized fibers.

7. The electrical component of claim 6 wherein said heat convertible carbonaceous fibers are thermally stabilized polyacrylonitrile fibers and said in situ heat converted conductive path comprises thermally stabilized polyacrylonitrile fibers.

8. The electrical component of claim 3 wherein said polymer matrix is from about 5 to about 70% by weight fibrous filler.

9. The electrical component of claim 8 wherein said polymer matrix is from about 10 to about 30% by weight fibrous filler.

10. The electrical component of claim 1 wherein said insulating polymer matrix has a resistivity greater than about $10^{14}$ ohm cm and said electrically conducting path has a resistivity less than about $10^9$ ohm cm.

11. The electrical component of claim 10 wherein said electrically conducting path has a resistivity less than about $10^3$ ohm cm.

12. The electrical component of claim 7 wherein said heat converted fibers are from about 1 to about 12 mm in length and from about $5 \times 10^{-3}$ to about $5 \times 10^{-2}$ mm in diameter.

13. The electrical component of claim 1 wherein the walls of said passageway taper down from a maximum cross section on said first side to a minimum cross section on said second side.

14. The electrical component of claim 1 wherein the walls of said passageway taper down from maximum cross sections at said first and second sides to a minimum cross section between said first and second sides.

15. The electrical component of claim 1 wherein said first side and said second side meet to form an angled corner and wherein said at least one passageway provides an electrically conducting path through the interior of said corner from said first side to said second side.

16. The electrical component of claim 5 including at least one electrical circuit on each of said first side and said second side connected by said at least one electrically conducting path.

17. The electrical component of claim 1 including at least one other electrical component mounted and/or connected thereto.

18. The method of forming at least one electrically conductive path in a three dimensional electrical component having a first side and a second side comprising an electrically insulating polymer matrix capable of heat conversion to an electrically conducting polymer matrix comprising providing a passageway in said polymer matrix connecting said first and second sides, said passageway having a tapered wall configuration through said matrix from said first side to said second side with constantly changing cross section of the passageway from said first side through the passageway to said second side, directing a laser beam to the walls of said passageway in said polymer matrix to heat said polymer matrix to a temperature sufficient to convert the electrically insulating polymer matrix to an electrically conductive polymer matrix thereby providing said at least one electrically conductive path.

19. The method of claim 18 wherein said electrically insulating polymer matrix comprises an electrically insulating polymeric material capable of heat conversion to an electrically conducting material.

20. The method of claim 18 wherein said electrically insulating polymer matrix is filled with an electrically insulating fibrous filler capable of heat conversion to an electrically conducting fibrous filler.

21. The method of claim 18 including the step of applying an adherent continuous coating of a conductive metal to said passageway.

22. The method of claim 18 including the step of providing a plurality of said at least one passageway providing a plurality of electrically conducting paths between said first side and said second side.

23. The method of claim 20 wherein said electrically insulating fibrous filler is heat convertible carbonaceous fibers and said electrically conducting path comprises in situ heat converted carbonaceous carbonized fibers.

24. The method of claim 23 wherein said heat convertible carbonaceous fibers are thermally stabilized polyacrylonitrile fibers and said in situ heat converted conductive path comprises thermally stabilized polyacrylonitrile fibers.

25. The method of claim 20 wherein said polymer matrix is from about 5 to about 70% by weight fibrous filler.

26. The method of claim 25 wherein said polymer matrix is from about 10 to about 30% by weight fibrous filler.

27. The method of claim 18 wherein said insulating polymer matrix has a resistivity greater than about $10^{14}$ ohm cm and said electrically conductive path has a resistivity less than about $10^9$ ohm cm.

28. The method of claim 27 wherein said electrically conductive path has a resistivity less than about $10^3$ ohm cm.

29. The method of claim 18 including the step of tapering the walls of said passageway down from a maximum cross section on said first side to a minimum cross section on said second side.

30. The method of claim 18 including the step of tapering the walls of said passageway down from maximum cross sections at said first and second sides to a minimum cross section between said first and second sides and the steps of directing said laser beam to the walls of said passageway from said first side and from said second side to form the conducting path.

31. The method of claim 18 including the step of mounting and connecting at least one other electrical component to said three dimensional electrical component.

32. A machine including a plurality of electrical components each requiring the supply of electrical current for proper functioning, said machine including at least one three dimensional electrical component having a first side and a second side comprising an electrically insulating polymer matrix capable of heat conversion to an electrically conducting polymer matrix, at least one passageway from said first side to said second side having a tapered wall configuration from said first side to said second side with constantly changing cross section of the passageway from said first side through the passageway to said second side, an electrically conducting path between said first side and said second side formed by the in situ heat conversion of the walls of said passageway in said electrically insulating polymer matrix.

33. The machine of claim 32 wherein said electrically insulating polymer matrix comprises an electrically insulating polymeric material capable of heat conversion to an electrically conducting material.

34. The machine of claim 32 wherein said electrically insulating polymer matrix is filled with an electrically insulating fibrous filler capable of heat conversion to an electrically conducting fibrous filler.

35. The machine of claim 32 wherein the walls of said passageway have an adherent continuous coating of a conductive metal plated thereon.

36. The machine of claim 32 wherein said at least one passageway comprises a plurality of said passageways providing a plurality of electrically conducting paths between said first side and said second side.

37. The machine of claim 34 wherein said electrically insulating fibrous fillers are heat convertible carbonaceous fibers and said electrically conducting path comprises in situ heat converted carbonaceous carbonized fibers.

38. The machine of claim 37 wherein said heat convertible carbonaceous fibers are thermally stabilized polyacrylonitrile fibers and said in situ heat converted conductive path comprises thermally stabilized polyacrylonitrile fibers.

39. The machine of claim 32 wherein said insulating polymer matrix has a resistivity greater than about $10^{14}$ ohm cm and said electrically conductive path has a resistivity less than about $10^9$ ohm cm.

40. The machine of claim wherein said electrically conductive path has a resistivity less than about $10^3$ ohm cm.

41. The machine of claim 32 wherein the walls of said passageway taper down from a maximum cross section on said first side to a minimum cross section on said second side.

42. The machine of claim 32 wherein the walls of said passageway taper down from maximums at said first and second sides to a minimum between said first and second sides.

43. The machine of claim 32 wherein said first side and said second side meet to form an angled corner and wherein said at least one passageway provides an electrically conducting path across the interior of said corner.

44. The machine of claim 32 wherein said component is a structural machine member.

45. The machine of claim 32 wherein said component is a circuit board having at least one electrical circuit on each of said first side and second side connected by said at least one electrically conducting path.

46. The machine of claim 32 wherein said component is a circuit board including at least one other electrical component mounted and/or connected thereto.

* * * * *